United States Patent
Chen et al.

(10) Patent No.: US 9,263,432 B2
(45) Date of Patent: Feb. 16, 2016

(54) HIGH VOLTAGE SEMICONDUCTOR DEVICE AND METHOD FOR MANUFACTURING THE SAME

(71) Applicant: Macronix International Co., Ltd., Hsinchu (TW)

(72) Inventors: Hsin-Liang Chen, Taipei (TW); Wing-Chor Chan, Hsinchu (TW); Shyi-Yuan Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/270,568

(22) Filed: May 6, 2014

(65) Prior Publication Data
US 2015/0325570 A1  Nov. 12, 2015

(51) Int. Cl.
| H01L 29/76 | (2006.01) |
| H01L 27/02 | (2006.01) |
| H01L 27/06 | (2006.01) |
| H01L 29/739 | (2006.01) |
| H01L 29/417 | (2006.01) |
| H01L 29/36 | (2006.01) |
| H01L 29/66 | (2006.01) |
| H01L 29/10 | (2006.01) |

(52) U.S. Cl.
CPC ........ *H01L 27/0274* (2013.01); *H01L 27/0623* (2013.01); *H01L 29/1095* (2013.01); *H01L 29/36* (2013.01); *H01L 29/41708* (2013.01); *H01L 29/66325* (2013.01); *H01L 29/7393* (2013.01)

(58) Field of Classification Search
CPC ............ H01L 27/0274; H01L 27/0623; H01L 29/7393
USPC .......................... 257/335–343, 355, 500–502
See application file for complete search history.

(56) References Cited

U.S. PATENT DOCUMENTS

| 5,406,096 | A | * | 4/1995 | Malhi | 257/114 |
| 5,896,043 | A | * | 4/1999 | Kumagai | 326/68 |
| 8,129,782 | B2 | * | 3/2012 | Knaipp | 257/339 |
| 8,570,784 | B2 | * | 10/2013 | Liu | 365/104 |
| 2002/0135555 | A1 | * | 9/2002 | Yang et al. | 345/98 |
| 2007/0158681 | A1 | * | 7/2007 | Kim et al. | 257/173 |
| 2008/0001636 | A1 | * | 1/2008 | Can | 327/65 |
| 2008/0225451 | A1 | * | 9/2008 | Ansel et al. | 361/56 |
| 2008/0238481 | A1 | * | 10/2008 | Maede et al. | 326/68 |
| 2009/0167369 | A1 | * | 7/2009 | Liu et al. | 327/108 |
| 2009/0267137 | A1 | * | 10/2009 | Choi et al. | 257/324 |
| 2010/0109785 | A1 | * | 5/2010 | Yamazaki | 330/310 |
| 2010/0219462 | A1 | * | 9/2010 | Darwish et al. | 257/329 |

* cited by examiner

*Primary Examiner* — Ori Nadav
(74) *Attorney, Agent, or Firm* — McClure, Qualey & Rodack, LLP

(57) ABSTRACT

A high voltage semiconductor device is provided, comprising a high voltage metal-oxide-semiconductor transistor (HV-MOS), and a normally-on low voltage metal-oxide-semiconductor transistor (LVMOS) electrically connected to the HVMOS. The HVMOS has a first collector and a first emitter, and the LVMOS has a second collector and a second emitter, wherein the second collector of the LVMOS is electrically connected to the first emitter of the HVMOS. The LVMOS electrically connected to the HVMOS provides an electrostatic discharge bipolar transistor (ESD BJT), such as a NPN-type ESD BJT.

17 Claims, 7 Drawing Sheets

HIGH VOLTAGE SEMICONDUCTOR DEVICE AND METHOD FOR MANUFACTURING THE SAME

BACKGROUND

1. Field of the Invention

The disclosure relates in general to a high voltage semiconductor device and a method for manufacturing the same, and more particularly to a high voltage semiconductor device with ESD protection and a method for manufacturing the same.

2. Description of the Related Art

With the development of semiconductor technology, the bipolar COMS DMOS (BCD) manufacturing technology has been widely used for high voltage semiconductor devices. An operating voltage of a semiconductor device for the BCD manufacturing technology has been increased, and therefore an on-chip electro-static discharge (ESD) protection design becomes a challenging task.

A high voltage semiconductor device usually has low on-state resistance (Rdson), so that an electro-static current is likely to concentrate in a surface or an edge of a drain during an electro-static event. High voltage current and high electric field will cause a physical destruction at a surface junction region. Based on a requirement for lowering the on-state resistance (Rdson), the surface or a lateral side of the high voltage semiconductor device cannot be increased. Therefore, it is a challenge to get a better ESD protection structure.

Also, a breakdown voltage of the high voltage semiconductor device is always greater than the operation voltage thereof. A trigger voltage of the high voltage semiconductor device is often higher than the breakdown voltage thereof quite a lot. Therefore, a protected device or an internal circuit usually has risks of damages during the electro-static event, before an ESD protection of the high voltage semiconductor device is turned on. To reduce the trigger voltage, it is usually required to construct an additional external ESD detection circuit.

Moreover, the high voltage semiconductor element usually has a low holding voltage. There is a possibility that the high voltage semiconductor device is triggered by an unwanted noise, a power-on peak voltage or a serge voltage and a latch-up may occur during the normal operation.

Furthermore, the high voltage semiconductor device usually has a field plate effect. The distribution of the electric field is sensitive, so the electro-static current is easy to concentrate at the surface or the edge of the drain during the electro-static event.

Other methods have been proposed for the ESD protection; however, those methods would require additional masks or manufacturing steps. One of the conventional methods for ESD protection is to add an additional device used for ESD protection only. The additional ESD device is a big size diode, a bipolar transistor (BJT), a metal oxide semiconductor transistor (MOS) being increased the surface or the lateral side, or a silicon controlled rectifier (SCR). The silicon controlled rectifier (SCR) has a low holding voltage, so the latch-up may easily occur during the normal operation.

SUMMARY

The disclosure relates to a high voltage semiconductor device with ESD protection and a method for manufacturing the same. According to the device of the embodiment, the normally-on LVMOS combined with the HVMOS requires no extra devices for ESD protection of the HV semiconductor device. The HV semiconductor device of the embodiment not only provides ESD protection, but also improves the electrical characteristics of the HV semiconductor device in DC (direct current) applications.

According to one embodiment of the present disclosure, a high voltage semiconductor device is provided, comprising a high voltage metal-oxide-semiconductor transistor (HVMOS), and a normally-on low voltage metal-oxide-semiconductor transistor (LVMOS) electrically connected to the HVMOS. The HVMOS has a first collector and a first emitter, and the LVMOS has a second collector and a second emitter, wherein the second collector of the LVMOS is electrically connected to the first emitter of the HVMOS. The LVMOS electrically connected to the HVMOS provides an electro-static discharge bipolar transistor (ESD BJT), such as a NPN-type ESD BJT.

According to one embodiment of the present disclosure, a method for manufacturing a high voltage semiconductor device is provided, comprising forming a high voltage metal-oxide-semiconductor transistor (HVMOS) at a substrate, and the HVMOS having a first collector and a first emitter; and forming a normally-on low voltage metal-oxide-semiconductor transistor (LVMOS) at the substrate and electrically connected to the HVMOS, and the LVMOS having a second collector and a second emitter. The second collector of the LVMOS is electrically connected to the first emitter of the HVMOS, thereby providing an electro-static discharge bipolar transistor (ESD BJT).

The disclosure will become apparent from the following detailed description of the preferred but non-limiting embodiments. The following description is made with reference to the accompanying drawings.

DETAILED DESCRIPTION

In the embodiment of the present disclosure, a high voltage semiconductor device with ESD protection and a method for manufacturing the same are provided. According to the embodiment, a high voltage semiconductor device comprises a high voltage metal-oxide-semiconductor transistor (HVMOS) and a normally-on low voltage metal-oxide-semiconductor transistor (LVMOS) electrically connected to the HVMOS, thereby providing a NPN type electro-static discharge bipolar transistor (ESD BJT). The HV semiconductor device of the embodiment not only provides ESD protection, but also improves the electrical characteristics of the HV semiconductor device in DC (direct current) applications. According to the embodiment, the HV semiconductor device having the normally-on LVMOS combined with the HVMOS requires no extra devices for ESD protection; therefore the total area of the HV semiconductor device is not increased and the same as a conventional HVMOS. During normal operation, the HVMOS and the normally-on LVMOS are turned on at the same time. Additionally, the HV semiconductor device of the embodiment can be trigged by a higher trigger current during normal operation, thereby preventing the unwanted latch-up event.

Compared to the conventional HVMOS, the HV semiconductor device of the embodiment also possesses low on-state resistance (Rdson), higher saturation current of the drain (Idsat), and higher breakdown voltage. Also, the HV semiconductor device of the embodiment can be fabricated by standard BCD (Bipolar CMOS DMOS) and triple well process, and it is no need to adopt additional masks or process. Accordingly, the HV semiconductor device of the embodiments can be manufactured by simple process, and adopting no time-consuming and expensive procedures.

The embodiment of the present disclosure could be implemented in many different types of the HV semiconductor devices, and the disclosure has no particular limitation. The embodiment is provided hereinafter with reference to the accompanying drawings for elaborating a high voltage semiconductor device with ESD protection and a method for manufacturing the same are provided. However, the present disclosure is not limited thereto. The descriptions disclosed in the embodiments of the disclosure such as detailed structures and material selections are for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Figure 1C:
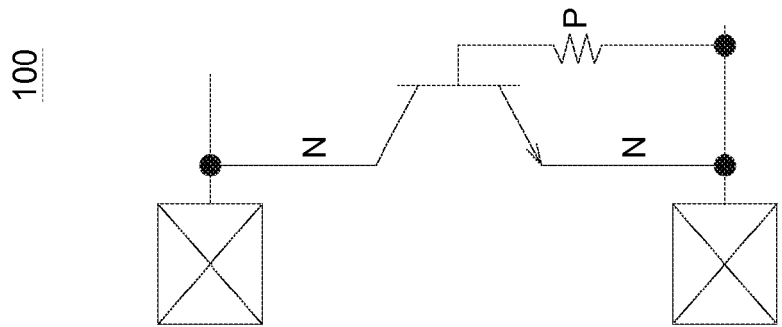
FIG. 1C is an equivalent circuit diagram of FIG. 1B.
Figure 1B:
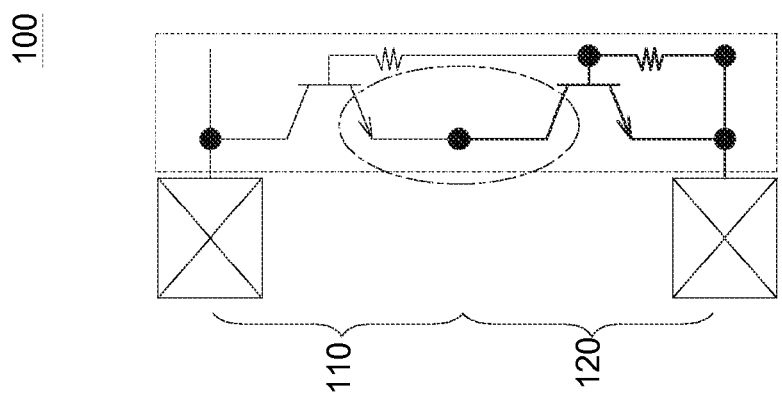
FIG. 1B is an equivalent circuit diagram of FIG. 1A.
Figure 1A:
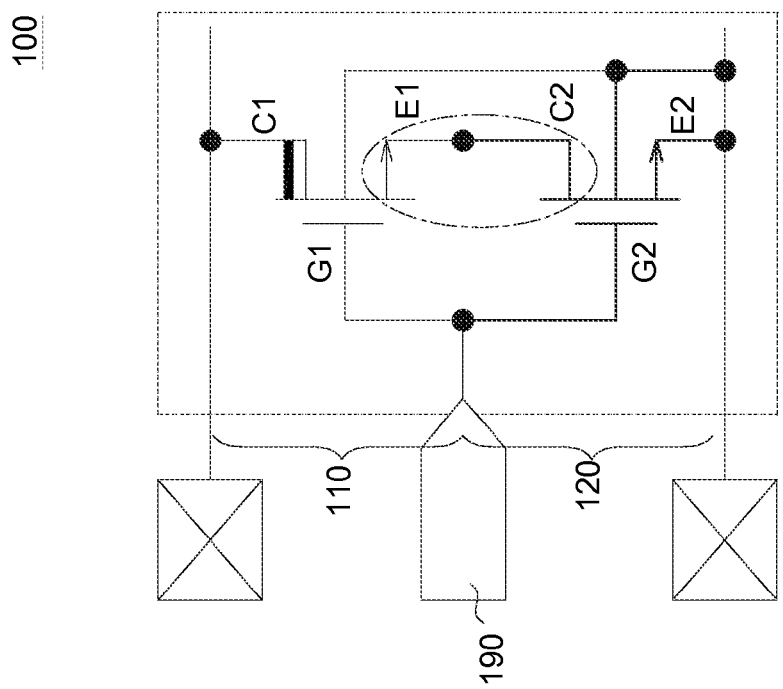
FIG. 1A is circuit diagram of a high voltage semiconductor device with ESD protection according to the embodiment of the disclosure.

FIG. 1A is circuit diagram of a high voltage semiconductor device with ESD protection according to the embodiment of the disclosure. A high voltage semiconductor device 100 comprises a HVMOS 110 and a normally-on LVMOS 120 electrically connected to the HVMOS 110. The HVMOS 110 has a first collector C1 and a first emitter E1. The LVMOS 120 has a second collector C2 and a second emitter E2, wherein the second collector C2 of the LVMOS 120 is electrically connected to the first emitter E1 of the HVMOS 110. A gate of LVMOS 120 is connected with a gate HVMOS 110, and both gates (i.e. a LV gate G2 and a HV gate G1) are electronically connected to an internal circuit 190.

Please also refer to FIG. 1B and FIG. 1C. FIG. 1B is an equivalent circuit diagram of FIG. 1A. FIG. 1C is an equivalent circuit diagram of FIG. 1B. The dotted circles of FIG. 1A and FIG. 1B represent merged and combined portions of circuits. According to one embodiment, the high voltage semiconductor device having the normally-on LVMOS 120 combined with the HVMOS 110 provides an electro-static discharge bipolar transistor (ESD BJT), such as NPN type ESD BJT.

Figure 2:
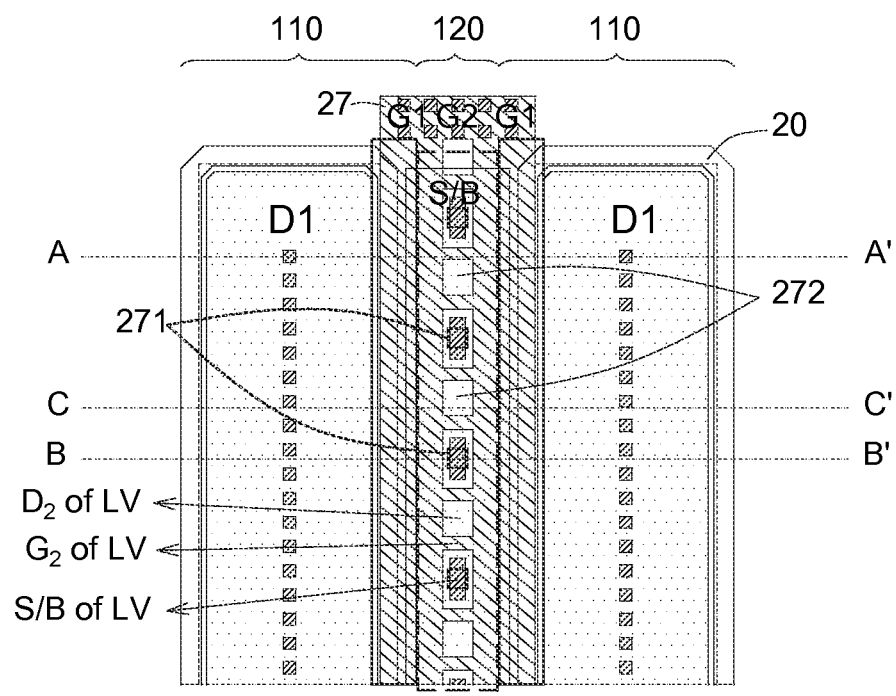
FIG. 2 is a top view of a high voltage semiconductor device with ESD protection according to the embodiment of the disclosure.
Figure 3A:
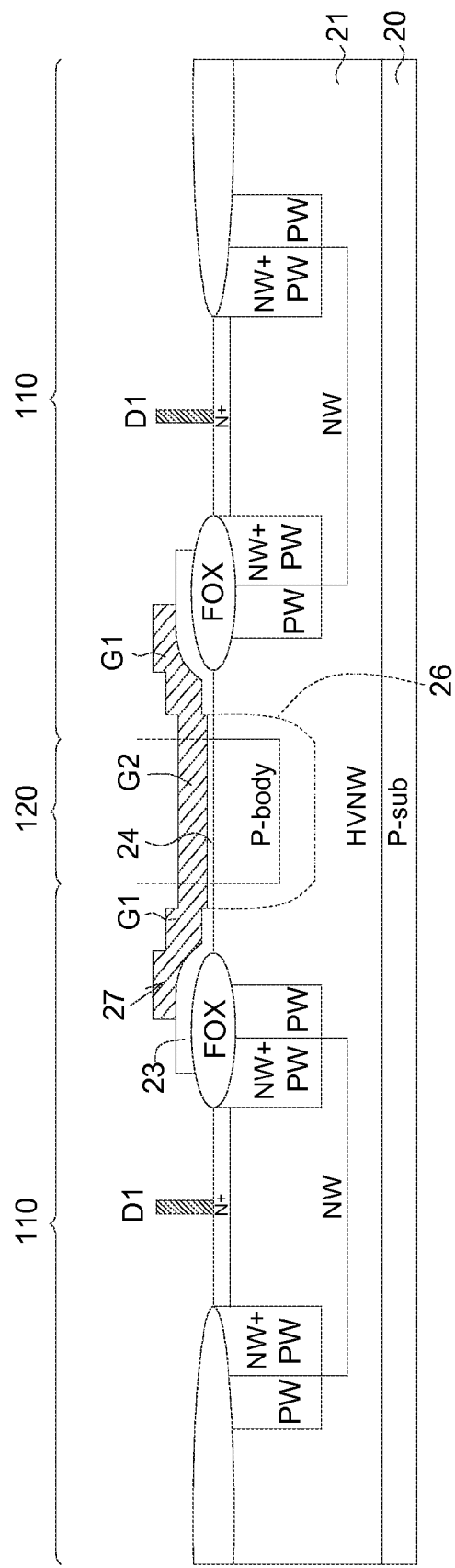
FIG. 3A~FIG. 3C illustrates the cross-sectional views along the cross-sectional lines A-A', B-B' and C-C' of FIG. 2, respectively.
Figure 3B:
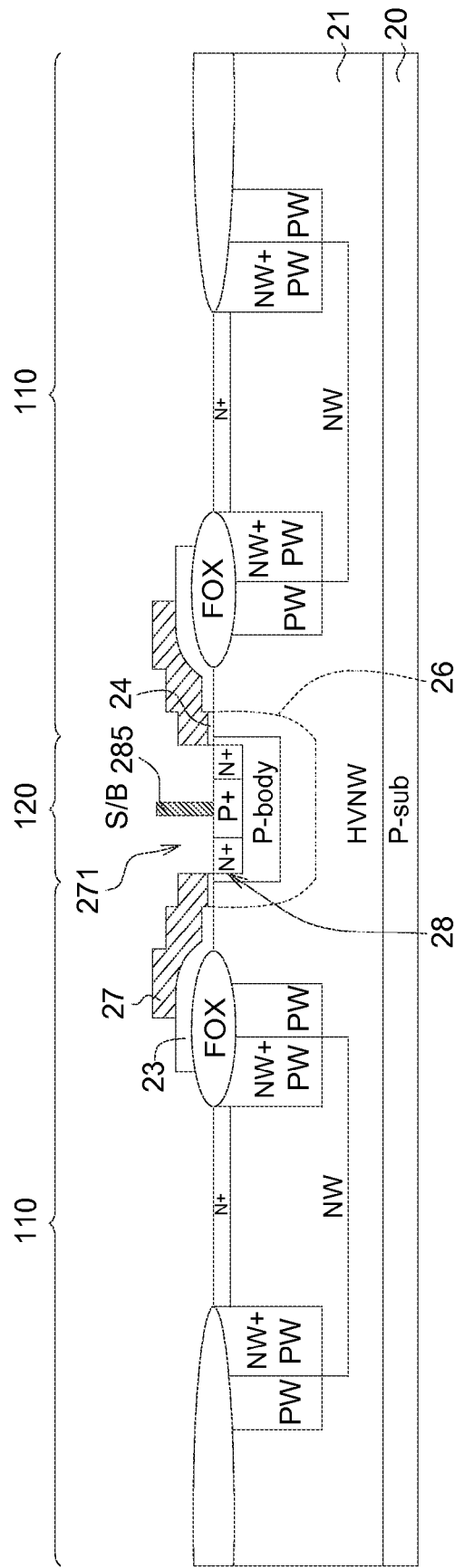
Figure 3C:
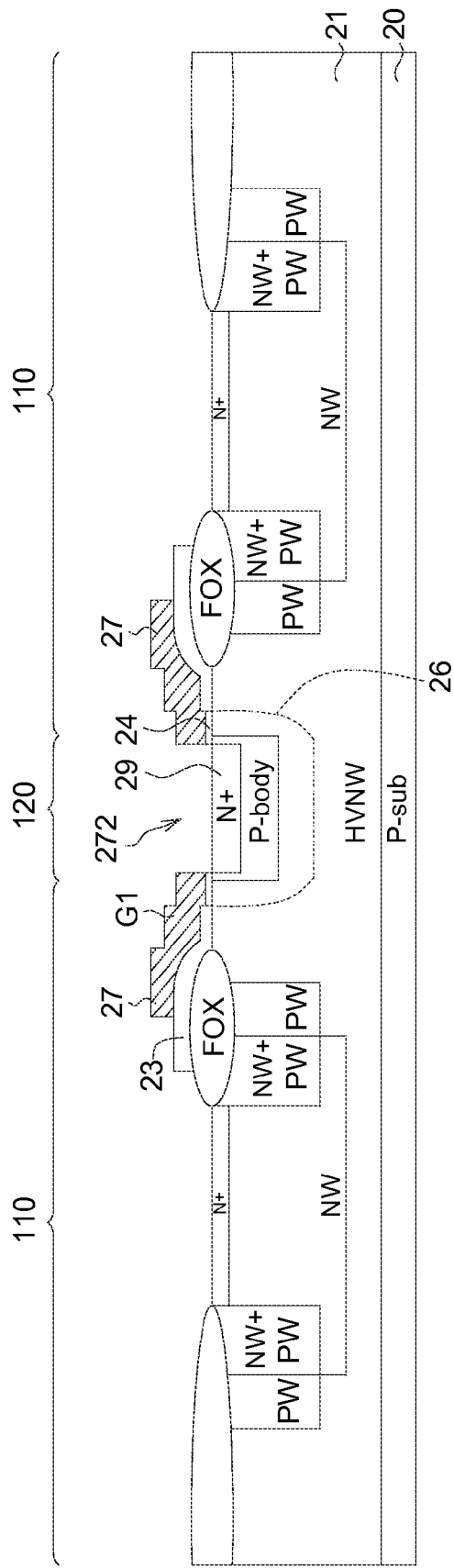

Please refer to FIG. 2 and FIG. 3A~FIG. 3C. FIG. 2 is a top view of a high voltage semiconductor device with ESD protection according to the embodiment of the disclosure. FIG. 3A~FIG. 3C illustrates the cross-sectional views along the cross-sectional lines A-A', B-B' and C-C' of FIG. 2, respectively. The position of the cross-sectional line A-A' of FIG. 2 is corresponding to the LV gate G2 of the normally-on LVMOS 120 and HV gate G1 of the HVMOS 110 of the high voltage semiconductor device 100. The position of the cross-sectional line B-B' of FIG. 2 is corresponding to the source/bulk (S/B) of the normally-on LVMOS 120 of the high voltage semiconductor device 100. The position of the cross-sectional line C-C' of FIG. 2 is corresponding to the drain (D2) of the normally-on LVMOS 120 of the high voltage semiconductor device 100.

According to the embodiment, a high voltage semiconductor device 100 comprises a patterned polysilicon layer 27 formed on a substrate 20, and the patterned polysilicon layer 27 has a poly-gate portion contiguously formed as the LV gate G2 of the normally-on LVMOS 120 and the HV gate G1 of the HVMOS 110, as shown in FIG. 2. Also, the patterned polysilicon layer 27 has a plurality of first hollows 271 and a plurality of second hollows 272 alternately and separately arranged in a column direction, such as in the y-direction. The first hollows 271 are corresponding to a plurality of S/B regions of the normally-on LVMOS 120 (and the HVMOS 110), and the second hollows 272 are corresponding to a plurality of drain D2 of the normally-on LVMOS 120. In the embodiment, the normally-on LVMOS 120 and the HVMOS 110 share the same source/bulk (S/B). Also, the drain regions D1 of the HVMOS 110 are positioned outside the normally-on LVMOS 120 and also arranged as columns (such as along the y-direction), which are parallel with the column of drain D2 and S/B of the normally-on LVMOS 120, as shown in FIG. 2.

According to the embodiment, fabrication on a first conductive type substrate, such as P-type substrate 20, is taken for illustration. FIG. 3A illustrates not only positions of the HVMOS 110, but also portions corresponding to the LV gate G2 of the LVMOS 120 and HV gate G1 of the HVMOS 110 of the high voltage semiconductor device 100. As shown in FIG. 3A, the HVMOS 110 and the normally-on LVMOS 120 are disposed in a HV N-type well (HVNW, second conductive type) 21 of the P-substrate 20. The HVMOS 110 further comprises the N-wells (NW), P-wells (PW) partially overlapped with the NW, insulations such as field oxide (FOX) adjacent to the LVMOS 120, thick oxides 23 on the FOX, N-type heavy doping regions (N+) corresponding to the drains D1, and the HV gate G1. The normally-on LVMOS 120 comprises a P-type body (P-body) in the HVNW 21, a thin oxide 24 connected with the thick oxides 23, and the LV gate G2, wherein the P-body extends downwardly from a surface of the P-substrate 20. It is shown in FIG. 3A that the LV gate G2 of the normally-on LVMOS 120 comprises a polysilicon portion covering the P-body and connected with the HV gate G1 of the HVMOS 110.

In one embodiment, the normally-on LVMOS 120 can optionally comprise a depletion region or a native implant region 26 in the HVNW 21, wherein the depletion region or the native implant region 26 extends downwardly from the surface of the P-substrate 20, and the P-body is disposed within the depletion region or the native implant region 26. When the same gate voltage is applied to the embodied devices with and without the depletion region or the native implant region 26, the former possesses good characteristics of lower on-state resistance (Rdson) and higher saturation current of drain (Idsat).

FIG. 3B illustrates not only positions of the HVMOS 110, but also portions corresponding to the source/bulk (SB) of the LVMOS 120 (and also of the HVMOS 110) of the high voltage semiconductor device 100. The components of the HVMOS 110 in FIG. 3B are identical to that in FIG. 3A, which are not repeatedly described. Besides the P-body in the depletion region or the native implant region 26, the thin oxide 24 connected with the thick oxides 23, and the patterned polysilicon layer 27 (forming the LV gate G2 of FIG. 3A), a source/bulk (S/B) region of the LVMOS 120 further comprises an NPN region 28 in the P-body, and the NPN region 28 extends downwardly from the surface of the P-substrate 20. As shown in FIG. 3B, the NPN region 28 comprises two N-type heavy doping regions (N+) and a P-type heavy doping region (P+) positioned between the N-type heavy doping regions (N+). Also, the LV S/B region of the LVMOS 120 further comprises a polysilicon island 285 and the first hollow 271 of the patterned polysilicon layer 27 surrounding the polysilicon island 285. The polysilicon island 285 is formed on and connected to the P-type heavy doping region (P+) of the NPN region 28 within the P-body, and the first hollow 271 surrounding the polysilicon island 285 exposes at least the N-type heavy doping regions (N+) of the NPN region 28. In one embodiment, the first hollow 271 exposes two N-type heavy doping regions (N+) and part of the P-type heavy doping region (P+) of the NPN region 28.

FIG. 3C illustrates not only positions of the HVMOS 110, but also portions corresponding to the drain (D2) of the LVMOS 120 of the high voltage semiconductor device 100. The components of the HVMOS 110 in FIG. 3C are identical to that in FIG. 3A, which are not repeatedly described. Besides the P-body in the depletion region or the native implant region 26, the thin oxide 24 connected with the thick oxides 23, and the patterned polysilicon layer 27 (forming the LV gate G2 of FIG. 3A), a drain (D2) region of the LVMOS 120 further comprises a N-type heavy doping region (N+) 29 in the P-body and the second hollow 272 of the patterned polysilicon layer 27. The N-type heavy doping region (N+) 29 extends downwardly from the surface of the P-substrate 20, and the second hollow 272 exposes at least the N-type heavy doping region (N+) 29.

According to the embodiment, the LV gate G2 of the LVMOS 120 is connected with the HV gate G1 of the HVMOS 110. Also, the drain side (i.e. LV drain D2) of the LVMOS 120 is common with the source side (i.e. the HV source) of the HVMOS 110. In the embodiment, the LVMOS 120 can be disposed vertically (ex: 90 degree-rotated) to the HVMOS 110 to reduce the device size of the high voltage semiconductor device 100 of the disclosure.

According to the high voltage semiconductor device of the embodiment, a HVMOS 110 and a normally-on LVMOS 120 electrically connected to the HVMOS 110 provides an electro-static discharge bipolar transistor (ESD BJT), such as a NPN type ESD BJT, and the equivalent circuit thereof is depicted in FIG. 1A, FIG. 1B, or FIG. 1C. During normal operation, the HVMOS and the normally-on LVMOS are turned on at the same time. When ESD event occurred in the embodied HV semiconductor device, the ESD current can be vented through deeper path of the parasitical bipolar transistor (BJT) for self ESD protection. Also, the HV semiconductor device of the embodiment having the normally-on LVMOS combined with the HVMOS requires no extra devices for ESD protection; therefore the total area of the HV semiconductor device is not increased and the same as a conventional HVMOS. Additionally, the HV semiconductor device of the embodiment can be trigged by a higher trigger current during normal operation, thereby preventing the unwanted latch-up event.

TLP (Transmission Line Pulse) testing is further conducted for investigating the ESD device characterizations of the embodied and conventional MOS devices. TLP testing extracts an I-V (current vs. voltage) curve for the device by subjecting the device to a series of short duration pulses. After each pulse, a DC leakage measurement is done to verify the integrity of junction.

Figure 4B:
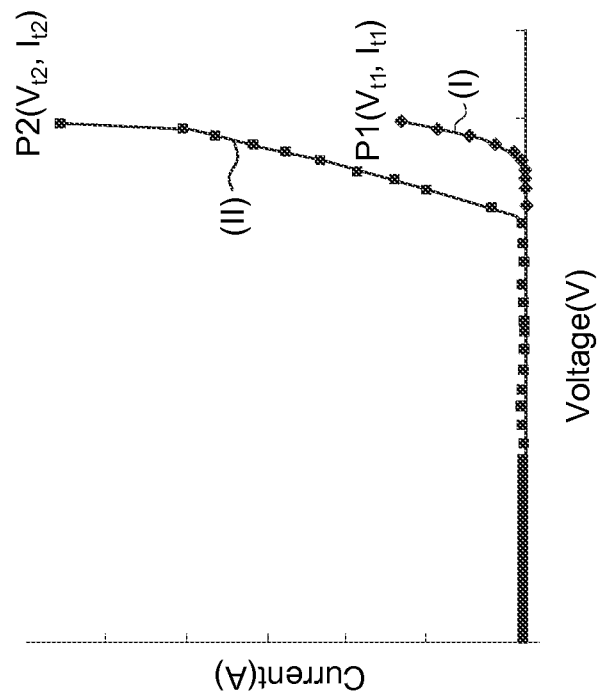
FIG. 4B is an enlarged drawing of the circled portion of FIG. 4A.
Figure 4A:
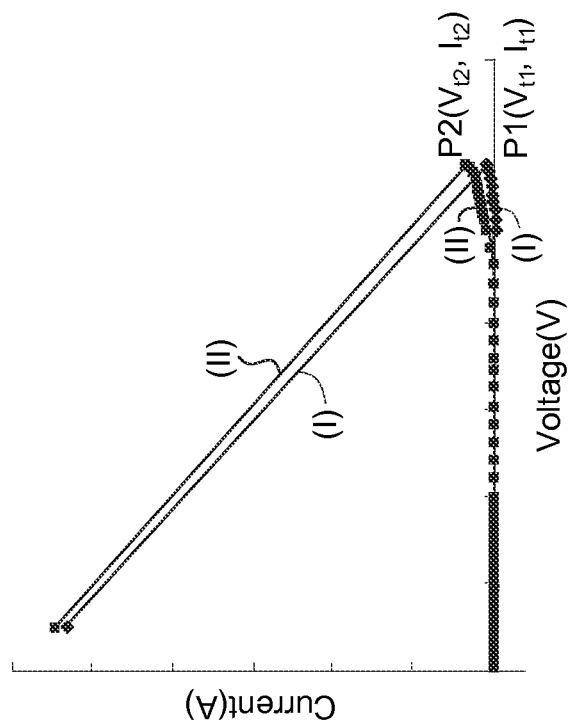
FIG. 4A shows the TLP curves (I) and (II) of the conventional MOS device and an embodied HV semiconductor device, respectively.

FIG. 4A shows the TLP curves (I) and (II) of the conventional MOS device and an embodied HV semiconductor device, respectively. FIG. 4B is an enlarged drawing of the circled portion of FIG. 4A. Points P1 and P2 of the TLP curves (I) and (II) represent the trigger points of the conventional MOS device and an embodied HV semiconductor device, respectively. Once the devices are triggered, the devices enter snap-back and conduct currents with a linear on-resistance. The trigger voltage $V_{t1}$ and the trigger current $I_{t1}$ of the Point P1 of the conventional MOS device, and the trigger voltage $V_{t2}$ and the trigger current $I_{t2}$ of the Point P2 of the embodied device are also labeled in FIG. 4A and FIG. 4B. It is clearly indicated in FIG. 4A and FIG. 4B that the HV semiconductor device of the embodiment can be trigged by a higher trigger current $I_{t2}$ (ex: about 400-500 mA), which is about 3 to 4 times of the trigger current $I_{t1}$ of the conventional MOS device. Current of a latch-up noise (ex: about 100-200 mA) is also labeled in FIG. 4B. Accordingly, the HV semiconductor device of the embodiment trigged by a higher trigger current during normal operation can solve the latch-up problem occurred in the conventional MOS device.

Moreover, the HV semiconductor device of the embodiment not only provides ESD protection, but also improves the electrical characteristics of the HV semiconductor device in DC (direct current) applications. During normal operation, the HVMOS and the normally-on LVMOS of the HV semiconductor device of the embodiment are turned on at the same time. Compared to the conventional HVMOS, the HV semiconductor device of the embodiment also possesses low on-state resistance (Rdson), higher saturation current of the drain (Idsat), and higher breakdown voltage.

Figure 5:
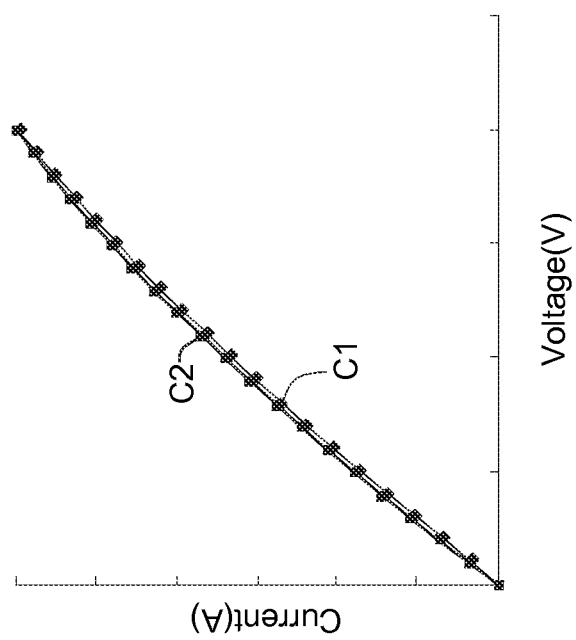
FIG. 5 shows DC I-V characteristics of the ON state resistances of a conventional MOS device and a HV semiconductor device of the embodiment.

FIG. 5 shows DC I-V characteristics of the ON state resistances of a conventional MOS device and a HV semiconductor device of the embodiment. In FIG. 5, the on-state resistance (Rdson) of the conventional MOS device is represented by the curve C1 (with symbols -♦-), and the Rdson of the HV semiconductor device of the embodiment is represented by the curve C2 (with symbols -■-). The results in FIG. 5 have indicated that the Rdson (C2) of the HV semiconductor device of the embodiment is lower than the Rdson of the conventional MOS device (C1).

Figure 6:
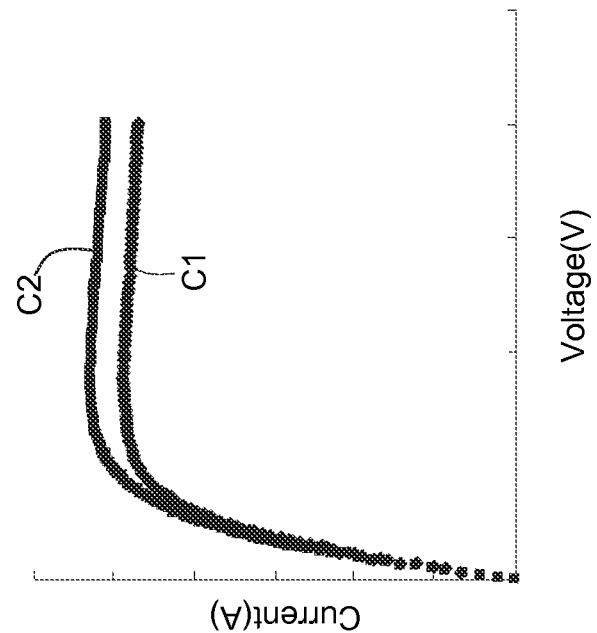
FIG. 6 shows I-V characteristics of the saturation current of drain (Idsat) of a conventional MOS device and a HV semiconductor device of the embodiment.

FIG. 6 shows I-V characteristics of the saturation current of drain (Idsat) of a conventional MOS device and a HV semiconductor device of the embodiment. Similarly, the saturation current of drain (Idsat) of the conventional MOS device is represented by the curve C1 (with symbols -♦-), and the Idsat of the HV semiconductor device of the embodiment is represented by the curve C2 (with symbols -■-). The results in FIG. 6 have indicated that the HV semiconductor device of the embodiment possesses the higher Idsat (C2).

The HV ESD protection is often implemented by HV ESD device in circuits, and the LV MOS is generally formed for low voltage application. According to the aforementioned descriptions, the HV semiconductor device of the embodiment having the normally-on LVMOS combined with the HVMOS provides an ESD BJT (such as NPN type ESD BJT). The embodied device not only provides ESD protection, but also improves the electrical characteristics of the HV semiconductor device in DC (direct current) applications. During normal operation, the HVMOS and the normally-on LVMOS are turned on at the same time. Compared to the conventional MOS, the embodied device can be trigged by a higher trigger current during normal operation, thereby preventing the unwanted latch-up event. Also, the HV semiconductor device of the embodiment requires no extra devices for ESD protection, and the total area of the HV semiconductor device is therefore not increased and would be the same as a conventional HVMOS. Additionally, the HV semiconductor device of the embodiment possesses low on-state resistance (Rdson), higher saturation current of the drain (Idsat), and higher breakdown voltage. In one embodiment, although the surface or lateral rules for ESD protection of the embodied device is increase, and the effective width of the embodied device is only 33%~50% of the width of the standard high voltage metal oxide semiconductor transistor, the embodied device still possesses the low on-state resistance (Rdson) electrical parameter and the same saturation current of drain (Idsat). Moreover, the HV semiconductor device of the embodiment can be fabricated by standard BCD (Bipolar CMOS DMOS) and triple well process, and it is no need to adopt additional masks or process. Thus, the method of manufacturing the HV semiconductor device of the embodiment is simple, and requires no time-consuming and expensive procedures.

Furthermore, the embodiment of the present disclosure could be applied to different types of semiconductor devices, and not limited to any specific type of semiconductor devices. For example, the high voltage ESD protection structure of the disclosure can be applied to any process and any operation voltage. It can be fabricated by any standard process without additional masks. The HV semiconductor device with ESD protection of the embodiment can be applied at the twin well process by removing the N+ buried layer, and can be applied at non-EPI process with triple well process. The embodiment also could be applied at single poly or double poly process. Also, the descriptions disclosed in the embodiments of the disclosure such as detailed structures and material selections are for illustration only, and can be modified or changed depending on actual requirements of the applications. For example, the N+ buried layer can be made of N-epi, or deep N type well, or multiple stacked N+ buried layers in the application of triple well process, and it can be removed in the application of twin well process. The LOCOS (local oxidation of silicon) can be shallow trench isolation (STI). The P type well (PW) can be a stack with P type well and P+ buried layer, or P− implant. The N type well (NW) can be N− implant. The HVMOS 110 can be any high voltage device for DC application.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high voltage semiconductor device, comprising:
a high voltage metal-oxide-semiconductor transistor (HVMOS), having a first collector and a first emitter; and
a normally-on low voltage metal-oxide-semiconductor transistor (LVMOS) electrically connected to the HVMOS, and the normally-on LVMOS having a second collector and a second emitter, wherein the second collector of the normally-on LVMOS is electrically connected to the first emitter of the HVMOS, wherein the HVMOS and the normally-on LVMOS are disposed in a HV N-type well (HVNW) of a P-type substrate (P-substrate), and the normally-on LVMOS further comprises a P-type body (P-body) in the HVNW and extending downwardly from a surface of the P-substrate,
wherein a LV source/bulk (S/B) region of the normally-on LVMOS further comprises:
an NPN region in the P-body and extending downwardly from the surface of the P-substrate, wherein the NPN region comprises two N-type heavy doping regions, and a P-type heavy doping region positioned between said two N-type heavy doping regions; and
a polysilicon island and a first hollow surrounding the polysilicon island, wherein the polysilicon island is formed on the P-type heavy doping region of the NPN region, and the first hollow exposes at least said the two N-type heavy doping regions of the NPN region.

2. The high voltage semiconductor device according to claim 1, wherein the normally-on LVMOS electrically connected to the HVMOS provides a NPN type electro-static discharge bipolar transistor (ESD BJT), a LV gate of the normally-on LVMOS is connected with a HV gate of the HVMOS, a LV drain of the normally-on LVMOS is common with a HV source of the HVMOS, the normally-on LVMOS and the HVMOS share a same source/bulk (S/B).

3. The high voltage semiconductor device according to claim 1, wherein the normally-on LVMOS further comprises a depletion region or a native implant region in the HVNW, wherein the depletion region or the native implant region extends downwardly from the surface of the P-substrate, and the P-body is disposed within the depletion region or the native implant region.

4. The high voltage semiconductor device according to claim 1, wherein a LV gate of the normally-on LVMOS comprises a polysilicon portion covering the P-body and connected with a HV gate of the HVMOS.

5. The high voltage semiconductor device according to claim 1, wherein a LV drain region of the normally-on LVMOS comprises:
one of the two N-type heavy doping regions in the P-body and extending downwardly from the surface of the P-substrate; and
a second hollow of a polysilicon layer, and the second hollow exposes at least the one of the two N-type heavy doping regions.

6. The high voltage semiconductor device according to claim 1, further comprising a patterned polysilicon layer formed on a substrate, wherein the patterned polysilicon layer comprises:
a poly-gate portion contiguously formed as a LV gate of the normally-on LVMOS and a HV gate of the HVMOS;
a plurality of the first hollows and a plurality of second hollows alternately and separately arranged, wherein the first hollows are overlapping with a plurality of the LV S/B regions of the normally-on LVMOS, and the second hollows are overlapping with a plurality of drain regions of the normally-on LVMOS.

7. The high voltage semiconductor device according to claim 6, wherein each of the LV S/B regions comprises the polysilicon island and one of the first hollows surrounding the polysilicon island, and the polysilicon island is connected to the P-type heavy doping region within the P-body, while the first hollow exposes at least the two N-type heavy doping regions at lateral sides of the P-type heavy doping region.

8. The high voltage semiconductor device according to claim 6, wherein each of the drain regions comprises one of the two N-type heavy doping regions within the P-body extending downwardly from the surface of the P-substrate, wherein the second hollow exposes said one of the two N-type heavy doping regions.

9. A high voltage semiconductor device, comprising:
a high voltage metal-oxide-semiconductor transistor (HV-MOS), having a first collector and a first emitter;
a normally-on low voltage metal-oxide-semiconductor transistor (LVMOS) electrically connected to the HVMOS, and the normally-on LVMOS having a second collector and a second emitter, wherein the second collector of the normally-on LVMOS is electrically connected to the first emitter of the HVMOS; and
a patterned polysilicon layer formed on a substrate, wherein the patterned polysilicon layer comprises
a poly-gate portion contiguously formed as a LV gate of the normally-on LVMOS and a HV gate of the HVMOS; and
a plurality of first hollows and a plurality of second hollows alternately and separately arranged, wherein the first hollows are overlapping with a plurality of source/bulk (S/B) regions of the normally-on LVMOS, and the second hollows are overlapping with a plurality of drain regions of the normally-on LVMOS,
wherein the normally-on LVMOS electrically connected to the HVMOS provides a NPN type electro-static discharge bipolar transistor (ESD BJT).

10. The high voltage semiconductor device according to claim 9, wherein a LV gate of the normally-on LVMOS is connected with a HV gate of the HVMOS, a LV drain of the normally-on LVMOS is common with a HV source of the HVMOS, the normally-on LVMOS and the HVMOS share a same source/bulk (S/B).

11. The high voltage semiconductor device according to claim 9, wherein each of the S/B regions comprises a polysilicon island and one of the first hollow surrounding the polysilicon island, and the polysilicon island is connected to a P-type heavy doping region within a P-body, while the first hollow exposes at least two N-type heavy doping regions at lateral sides of the P-type heavy doping region.

12. The high voltage semiconductor device according to claim 9, wherein each of the drain regions comprises a N-type heavy doping region within a P-body extending downwardly from the surface of the substrate, wherein the second hollow exposes said N-type heavy doping region.

13. A method for manufacturing a high voltage semiconductor device, comprising:
forming a high voltage metal-oxide-semiconductor transistor (HVMOS) at a substrate, and the HVMOS having a first collector and a first emitter; and
forming a normally-on low voltage metal-oxide-semiconductor transistor (LVMOS) at the substrate and electrically connected to the HVMOS, and the normally-on LVMOS having a second collector and a second emitter, wherein the second collector of the normally-on LVMOS is electrically connected to the first emitter of the HVMOS, thereby providing an electro-static discharge bipolar transistor (ESD BJT), wherein the HVMOS and the normally-on LVMOS are disposed in a HV N-type well (HVNW) of a P-type substrate (P-substrate), and the normally-on LVMOS further comprises a P-type body (P-body) in the HVNW and extending downwardly from a surface of the P-substrate,
wherein a LV source/bulk (S/B) region of the normally-on LVMOS further comprises:
an NPN region in the P-body and extending downwardly from the surface of the P-substrate, wherein the NPN region comprises two N-type heavy doping regions, and a P-type heavy doping region positioned between said two N-type heavy doping regions; and
a polysilicon island and a first hollow surrounding the polysilicon island, wherein the polysilicon island is formed on the P-type heavy doping region of the NPN region, and the first hollow exposes at least said the two N-type heavy doping regions of the NPN region.

14. The method according to claim 13, wherein a LV gate of the normally-on LVMOS is connected with a HV gate of the HVMOS, a LV drain of the normally-on LVMOS is common with a HV source of the HVMOS, the normally-on LVMOS and the HVMOS share a same source/bulk (S/B).

15. The method according to claim 13, wherein the normally-on LVMOS further comprises:
a depletion region or a native implant region in the HVNW, wherein the depletion region or the native implant region extends downwardly from the surface of the P-substrate, and the P-body is disposed within the depletion region or the native implant region.

16. The method according to claim 15, wherein a LV drain region of the normally-on LVMOS comprises:
one of the two N-type heavy doping regions in the P-body and extending downwardly from the surface of the P-substrate; and
a second hollow of a polysilicon layer, and the second hollow exposes at least the one of the two N-type heavy doping regions.

17. The method according to claim 13, further comprising forming a patterned polysilicon layer on a substrate, wherein the patterned polysilicon layer comprises:
a poly-gate portion contiguously formed as a LV gate of the normally-on LVMOS and a HV gate of the HVMOS;
a plurality of the first hollows and a plurality of second hollows alternately and separately arranged, wherein the first hollows are overlapping with a plurality of the LV S/B regions of the normally-on LVMOS, and the second hollows are overlapping with a plurality of drain regions of the normally-on LVMOS,
wherein each of the LV S/B regions comprises the polysilicon island and one of the first hollows surrounding the polysilicon island, and the polysilicon island is connected to the P-type heavy doping region within the P-body, while the first hollow exposes at least the two N-type heavy doping regions at lateral sides of the P-type heavy doping region,
wherein each of the drain regions comprises one of the two N-type heavy doping regions within the P-body extending downwardly from the surface of the P-substrate, wherein the second hollow exposes said one of the two N-type heavy doping regions.

* * * * *